United States Patent
Tomita et al.

(10) Patent No.: US 6,870,452 B2
(45) Date of Patent: Mar. 22, 2005

(54) PERSISTENT CURRENT SWITCH AND METHOD FOR THE SAME

(75) Inventors: Masaru Tomita, Tokyo (JP); Masato Murakami, Tokyo (JP); Koichiro Sawa, Tokyo (JP)

(73) Assignees: International Supperconductivity Technology Center, the Juridical Foundation, Tokyo (JP); Railway Technical Research Institute, Tokyo (JP)

( * ) Notice: Subject to any disclaimer, the term of this patent is extended or adjusted under 35 U.S.C. 154(b) by 29 days.

(21) Appl. No.: 10/057,819

(22) Filed: Jan. 25, 2002

(65) Prior Publication Data

US 2002/0190824 A1 Dec. 19, 2002

(30) Foreign Application Priority Data

May 31, 2001 (JP) ..................... P2001-163707

(51) Int. Cl.[7] .............................................. H01F 1/00
(52) U.S. Cl. ....................................... 335/216; 335/299
(58) Field of Search ..................... 335/216, 296–301; 324/318–322; 505/233, 302, 739, 818; 427/62–3

(56) References Cited

U.S. PATENT DOCUMENTS 6,297,199 B1 * 10/2001 Tomita et al. .............. 505/233

FOREIGN PATENT DOCUMENTS

| EP | 0649151 | * | 4/1995 | |
|----|---------|---|--------|---|
| JP | 1-148712 | * | 6/1989 | |
| JP | 3144675 | | 6/2000 | ............ C01G/3/00 |
| JP | 3100375 | | 1/2001 | ........... C04B/41/89 |
| WO | 98/47186 | * | 10/1998 | |

OTHER PUBLICATIONS

Masaru Tomita et al., "Mechanical Persistent Current Switch of Resin–Impregnated Bulk superconductors", distributed at a joint seminar at the Institute of Electrical Engineers of Japan on Jan. 26, 2001, Tokyo, Japan (Abstract in English).

* cited by examiner

Primary Examiner—Lincoln Donovan
(74) Attorney, Agent, or Firm—Darby & Darby (57) ABSTRACT

In order to provide an inexpensive mechanical persistent current switch with a short operation time and a large capacity without causing energy loss, a mechanical persistent current switch comprises a bulk member which is made of RE—Ba—Cu—O superconductor (RE is a rare earth element), connector material, and the bulk member made of RE—Ba—Cu—O superconductor is made by a melt process in which resin is impregnated, and an current terminal and a voltage terminal pasted onto the bulk member.

1 Claim, 7 Drawing Sheets

($R_L$ IS A PROTECTIVE RESISTANCE)

PERSISTENT CURRENT SWITCH AND METHOD FOR THE SAME

BACKGROUND OF THE INVENTION

1. Field of the Invention

The present invention relates to a mechanical persistent current switch and a method for the same which are preferable for a persistent current switch (PCS) for storing electric current in a superconducting coil such as a superconducting magnetic energy storage (SMES) device or the like.

For a magnetically levitated train, a superconducting electromagnetically propelled boat, a superconducting device for medical diagnosis such as magnetic resonance imaging (MRI) device, and a SMES device, a PCS is used in order to run the superconducting magnet in a persistent current mode. Stable conductivity of large amounts of currents, quick switching operation, and a small energy loss are required for a PCS.

2. Description of Related Art

As standard methods to realize a persistent current mode, three different switching methods have been proposed. Those are thermal, magnetic, and mechanical methods. Presently, the thermal method is mainly employed for a persistent current switch of a superconducting coil for a magnetically levitated train and a superconducting electromagnetic propelled boat or the like.

However, a thermal PCS has a problem in that the operating time for switching is long especially when a large amount of transport currents are passed. For example, the off-switching time for a thermal persistent current switch of 10 kA class using a superconducting coil was 180 seconds. The on-switching time of the same switch was even longer and reached 813 seconds. This is simply due to the fact that it takes a long time to drive a PCS in a large volume from the superconducting to the normal conducting state. It takes a longer time to cool the superconducting coil switch from the normal to the superconducting state.

In the case of a magnetically levitated train and a superconducting electromagnetically propelled boat in which the frequency of switching is extremely low, a slow switching time is not a serious problem. The same idea applies to the case of a superconducting device for medical diagnosis. For these applications, a slow switching time and a small energy loss is not a problem, and therefore, research and development of a thermal PCS are actively performed.

However, the number of switching times is large in a SMES device, and hence a thermal PCS is not suitable. A thermal PCS has another problem that a certain amount of currents are flowing through the switch even in a off state, because the switch is in a normal conducting state and the resistance is finite. Thus an energy loss is unavoidable. A magnetic PCS has the same problem.

In contrast, the electric circuit can be completely shut in the off state of a mechanical persistent current switch (MPCS), since it mechanically opens connector terminals. The switching time is also very short for a MPCS, since a switching operation is simply controlled by closing and opening connector terminals. Thus the MPCS is considered to be more suitable for a superconducting magnet in which on/off switching is frequently repeated.

When superconducting materials were used for connecting terminals of a MPCS, it is possible to supply electric currents to a superconducting magnet from a power supply with no resistance. It is also possible to disconnect the electric current perfectly when the switch is off.

Superconducting materials used for a MPCS, however have been metal alloys such as NbTi and the like. The critical temperature $T_c$ of such metal superconductors was so low that refrigeration by liquid helium (temperature: 4.2K) was indispensable, and hence the cost of facilities was a problem.

Because of such a background, the development of a MPCS, which functions sufficiently at high temperatures such as 77.3 K the boiling point of liquid nitrogen and reduces the facility cost to a great extent, has been desired.

In 1987 RE—Ba—Cu—O oxide superconductors (RE is a rare earth element) that showed higher critical temperature $T_c$ than the boiling point of liquid helium were discovered. With this advent, a trial for producing a MPCS was conducted by using such high temperature superconductor (HTSC) as materials for connectors. At the early stage of research, HTSC materials were prepared by sintering methods. The contact resistance between sintered HTSC materials was high; thus a state of superconductivity was not realized. Therefore, the research was discontinued because the development of a MPCS of desired performance was not clearly foreseen.

SUMMARY OF THE INVENTION

The object of the present invention is to provide an inexpensive MPCS with short switching time. Such a MPCS can supply electric currents from a power supply to a superconducting magnet with a large capacity without causing energy loss when a switch is on. It can disconnect the electric current when a switch is turned off.

The inventors of the present invention became aware that bulk RE—Ba—Cu—O superconductors (RE is rare earth element) made by a melt process have superior properties such as large flux pinning force and high critical current density in a high temperature and high magnetic field region to sintered RE—Ba—Cu—O superconductors. Melt-processed bulk RE—Ba—Cu—O superconductors are also highly dense as compared with sintered RE—Ba—Cu—O, which is attractive for MPCS applications.

However, it was difficult to pass supercurrents between mechanically contacted surfaces even when melt-processed RE—Ba—Cu—O superconductors were used as connector materials. After investigating the factors that hinder the maintenance of zero-resistance state between mechanically contacted surfaces of connectors made of bulk RE—Ba—Cu—O superconductor, the inventors of the present invention found the following facts (a) and (b).

(a) In order to maintain the superconducting state between mechanically contacted surfaces of connectors made of superconductor, the surfaces of the connectors must be contacted with an interval less than several nanometers. It is difficult to realize such a condition in the case of sintered materials with poor smoothness of the surface. In contrast, in the case of connectors made of dense bulk RE—Ba—Cu—O superconductors made by a melt process, a smooth surface can be obtained by surface polishing, and thus it is possible to produce such a condition by applying pressure to the contact surfaces.

(b) It is known that oxygen is highly active at the surfaces of RE—Ba—Cu—O high temperature superconductors, and hence an insufficient oxygen layer or an insulating layer tends to be formed on the free surface. Due to this fact the superconducting state between the mechanically contacted surfaces is hampered. Such problems caused by thin insulating surface layer could be solved by once passing the currents larger than a critical value. This is similar to a dielectric breakdown. With this treatment, the MPCS made of melt-processed RE—Ba—Cu—O superconductors can pass zero-resistance currents.

There was another problem before practical use of the MPCS was realized. That is, mechanical properties of bulk RE—Ba—Cu—O superconductors made by a melt process were inferior to those of metals since they are ceramic materials. It was found that a connector material of the MPCS using such a superconductor could not endure the pressure applied to reduce the contact resistance.

In addition, cracks tends to occur along the cleavage surface of $REBa_2Cu_3Oy$ that is the main phase of a bulk RE—Ba—Cu—O superconductor due to an influence of distortion during the tetragonal to orthorhombic phase transformation. These cracks further develop due to the thermal stress during thermal cycles. In addition, the surface of connector materials experiences repetitive mechanical contacts at every switching operation in the case of a MPCS, thus an extension of internal crack proceeds due to the impact made during the switching operation. The presence of cracks hinders the current flow inside the bulk superconductor or the connector material, which will cause a decrease in transport capacity of a PCS.

Hence, the inventors of the present invention applied a resin impregnation method to bulk RE—Ba—Cu—O superconductors or connector materials for enhancing the mechanical strength of connector materials according to the technique in Japanese Patent (Granted) Publication No. 3144675 and No. 3100370. As a result, the inventors of the present invention succeeded in increasing the mechanical strength of connector materials or bulk RE—Ba—Cu—O superconductors to the level almost twice as high as those of conventional materials. A MPCS was then manufactured by using a connector material with resin impregnation and subjected to transport measurements. A comparative test was also performed on the MPCS using melt-processed RE—Ba—Cu—O superconductors without resin impregnation. The transport measurements were performed with immersing the MPCS in liquid nitrogen. The contact surfaces were mechanically pressed each other, and electric currents were passed. First the voltage began increasing but fluctuated unstably. The voltage suddenly decreased when the voltage reached a certain value, hereafter the voltage increased at a constant rate just like the ohmic resistance. When the currents were decreased, the voltage decreased at the constant rate. With further decreasing currents, when the voltage reached a critical value, the voltage became almost zero, and the superconducting state was retained below this current level afterwards. It was also found that the critical currents or the range of the superconducting region could be increased by increasing the pressure applied to the contact surfaces.

The present invention was made in consideration of the above discoveries. The present invention provides a MPCS and the method for its usage shown according to the following (1) to (5).

(1) A mechanical persistent current switch with connector materials made of bulk RE—Ba—Cu—O superconductors (RE is a rare earth element) made by a melt process to which resin impregnation is performed.

(2) A mechanical persistent current switch according to above (1) in which the impregnated resin contains fillers having small thermal expansion coefficients in a dispersed manner.

(3) A mechanical persistent current switch according to above (1) in which the contact surfaces of connectors are polished.

(4) A mechanical persistent current switch according to above (1) in which the direction of electric current is parallel to the ab surface by making the contact surfaces perpendicular to the ab surface of the connector.

(5) A method of usage of a mechanical persistent current switch according to above (1) which is subjected to a pre-treatment of passing currents until the ohmic resistance behavior appears prior to using the mechanical persistent current switch.

According to the present invention, it is possible to supply currents from a power supply to a superconducting magnet in large capacity without energy loss when a persistent current switch is turned on. It is also possible to provide an inexpensive mechanical persistent current switch with short operation time in which the current can be completely disconnected when the persistent current switch is turned off. Thus, industrially significant effects can be brought, which contributes to improving the performance of a superconducting magnetic energy storage.

PREFERRED EMBODIMENT

In the present invention, a bulk RE—Ba—Cu—O superconductor (RE is a rare earth such as Y, La, Nd, Sm, Eu, Gd, Dy, Ho, Er, Tm, Yb) is a copper oxide superconductor of which the main phase is $REBa_2Cu_3Oy$ with $RE_2BaCuO_5$ as a secondary phase. A bulk RE—Ba—Cu—O superconductor may include Ag for the purpose of increasing the mechanical strength. Furthermore, the bulk superconductor is manufactured by a melt process. Required performance as a connector material for a mechanical persistent current switch cannot be obtained with RE—Ba—Cu—O superconductors manufactured by a sintering method.

For a method of impregnating resin into a bulk RE—Ba—Cu—O superconductor made by a melt process, the technique according to Japanese Patent (Granted) Publication No. 3144675 in that the resin is impregnated into a bulk superconductor by immersing it in molten resin under reduced pressure can be applied.

For a resin which is impregnated into a bulk superconductor, epoxy resin, urea resin, phenol resin, unsaturated polyester resin, polyurethane, alkyd resin, melamine resin or the like can be used. From viewpoints of the optimization of functions, epoxy resin is preferable. With regard to a connector material made of bulk superconductors with resin impregnation, the internal stress will appear due to a difference in thermal expansion coefficients between the bulk superconductor and the resin during thermal cycles; which may cause damage to the bulk body. In order to prevent the damage, thermal expansion coefficient of bulk superconductor should be close to that of the resin for a wide temperature range. For this purpose, it is preferable that fillers having small thermal expansion coefficient are dispersed in a resin so that an impregnated resin layer has the thermal expansion coefficient as close as possible to that of a bulk superconductor.

For a method of forming an impregnated resin layer containing fillers with small thermal expansion coefficient in a bulk superconductor, the technique according to Japanese Patent (Granted) Publication No. 3100370 can be applied. Here the resin containing such fillers is impregnated into a bulk superconductor by immersing it in molten resin with fillers under reduced pressure.

As for filler materials that are dispersed in order to decrease the thermal expansion coefficient of the resin, quartz, calcium carbonate, alumina, aluminum hydroxide, glass, talc, and calcium sulfate and the like can be used, and it is preferable that these fillers be used in the form of fine powders.

In order to pass zero-resistance currents between mechanically contacted surfaces of connector materials made of bulk RE—Ba—Cu—O superconductors, it is necessary to contact the surfaces with the gap of several nanometers range as mentioned before. For this purpose, it is preferable that the contact surfaces of connector materials are finely polished in addition to an increase in the load pressure.

Refined polishing of the contact surfaces of connector materials can enlarge an effective contacting area; thus it is possible to pass large zero-resistance currents between mechanically contacted surfaces of connector materials.

Furthermore, it is found that there is a case in which zero-resistance currents cannot be passed between mechanically contacted surfaces of connector materials even when their surfaces are finely polished. The reason is that the orientation of connector materials made of bulk superconductors is not properly aligned.

It was found that such a problem could be solved by controlling the contact surfaces perpendicular to the ab surface of connector materials made of bulk RE—Ba—Cu—O superconductors. With this configuration, the current flows along the ab direction, which is a preferred orientation for a supercurrent flow.

Nevertheless, the function of the mechanical persistent current switch itself was not hampered even when the orientation of connector materials did not meet the above condition.

For a mechanical persistent current switch, in which the connector materials are melt-processed bulk RE—Ba—Cu—O superconductors with resin impregnation, it is important to perform the pre-treatment of passing currents until the ohmic resistance behavior appears. If this treatment is not performed, it is not possible to pass zero-resistance currents between mechanically contacted surfaces of the connector materials.

In general, thin insulating surface layers that disrupt superconductivity have low oxygen content due to an instability of oxygen adhesion at the surface of a bulk RE—Ba—Cu—O superconductor. Thus an ohmic contact cannot be obtained when the current is passed between mechanically contacted bulk superconductors. The voltage values also fluctuate during an increasing current process. However, when the applied current exceeds a critical value, the contact resistance suddenly drops presumably by breaking the insulating layer just like the dielectric breakdown phenomenon. Hereafter, the voltage-current characteristics are ohmic and the superconducting state is also achieved at a low current level or below the critical currents.

DETAILED DESCRIPTION OF THE INVENTION

Next, the present invention is explained in detail with reference to the drawings.

First, a bulk Y—Ba—Cu—O superconductor with 10 wt % of Ag is manufactured by a melt process. The shape of bulk Y—Ba—Cu—O superconductor is a cubic with the side length of 10 mm as shown in FIG. 1.

Figure 1:
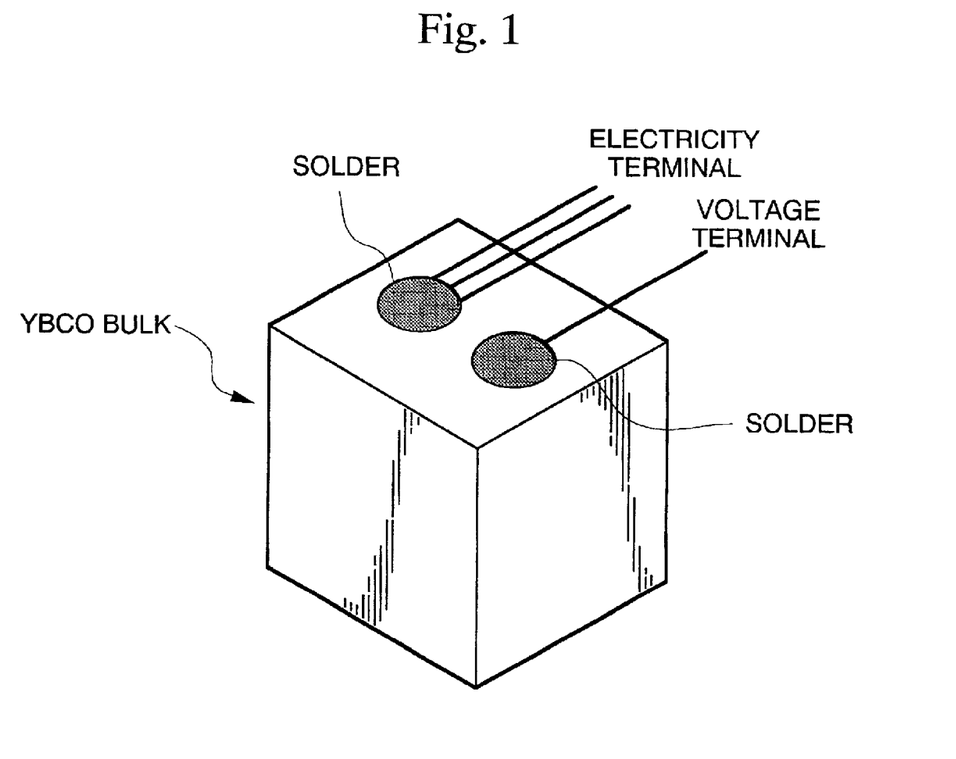
FIG. 1 is a view of a connector material (bulk superconductor) manufactured in an embodiment.

Next, a current terminal and a voltage terminal are pasted onto the bulk member with an ultrasonic soldering method as shown in FIG. 1. The terminals thus formed are the connectors of the mechanical persistent current switch.

In this case, connectors are made such that the contact surfaces of the bulk member are perpendicular to the ab surface so that a direction of current is along the ab surface.

Next, a reinforcement treatment of resin impregnation is performed to the connector materials (bulk superconductors). For the resin for impregnation, an epoxy resin of bisphenol A is used as a base, aromatic polyamine is used as a hardening agent. A powder of quartz was added to the resin with the resin/quartz ratio of 100:90 in order to make the thermal expansion coefficient of the resin close to that of the connector materials (bulk superconductors). While pre-heating to 30° C., a mixing operation was performed, and then degassing was performed under vacuum.

Next, a connector material (bulk superconductor) to which electrode terminals such as current terminals and voltage terminals are connected is pre-heated to 70° C., then the resin and the hardening agent which are mixed with quartz powder are attached, the pressure is reduced in a vacuum bath, and then the pressure is increased above the atmospheric pressure. Furthermore, heating was performed at 80° C. for six hours, and at 120° C. for two hours. During that heating, the resin was put in a mold and hardening treatment was performed so that the resin could be assembled in the testing device immediately after heat treatment to form a cylindrical shape.

From the same batch used for connector materials (bulk superconductors) that were supplied for an experiment of a persistent current switch, a small specimen 1.31 mm×1.33 mm×0.21 mm in size was cut and subjected to the critical current density ($J_c$) measurements.

The DC magnetization of the sample was measured with a SQUID magnetometer with the field parallel to the c-axis of the sample. The $J_c$ values were estimated on the basis of the extended Bean critical state model.

Figure 2:
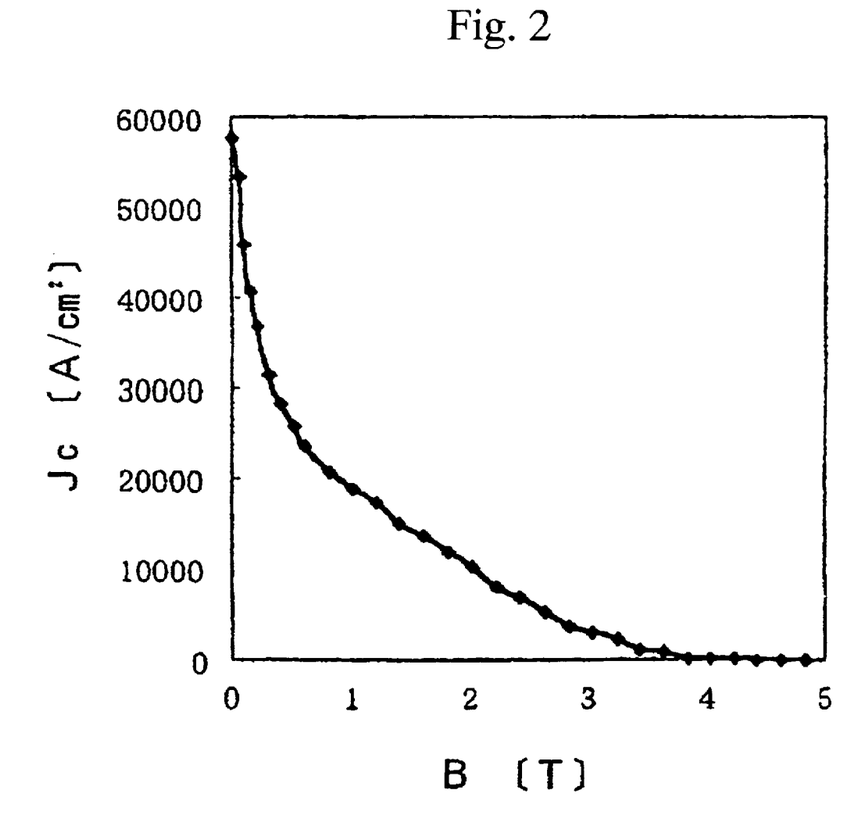
FIG. 2 is a chart of field dependence of critical current density ($J_c$) of a connector material (bulk superconductor) manufactured in an embodiment.

The result of measurement of the critical current density $J_c$ is shown in FIG. 2. The $J_c$ values of the obtained connector material were 57,667 A/cm$^2$ at 77 K at 0 T, 25,767 A/cm$^2$ at 77 K at 0.5 T and 18,992 A/cm$^2$ at 77 K at 1 T.

Therefore, it can be said that the persistent current switch can retain high critical current density ($J_c$) and obtain a sufficient current carrying capacity even when the PCS is installed in the space where it experiences large magnetic fields.

Here, the direction of magnetic field was parallel to the c-axis; thus the $J_c$ values thus obtained were lower than the actual arrangement of the PCS in that the magnetic field is directed parallel to the ab surface. In this configuration, stacking faults function as an effective pinning center; thus it is possible to obtain higher $J_c$.

Figure 3:
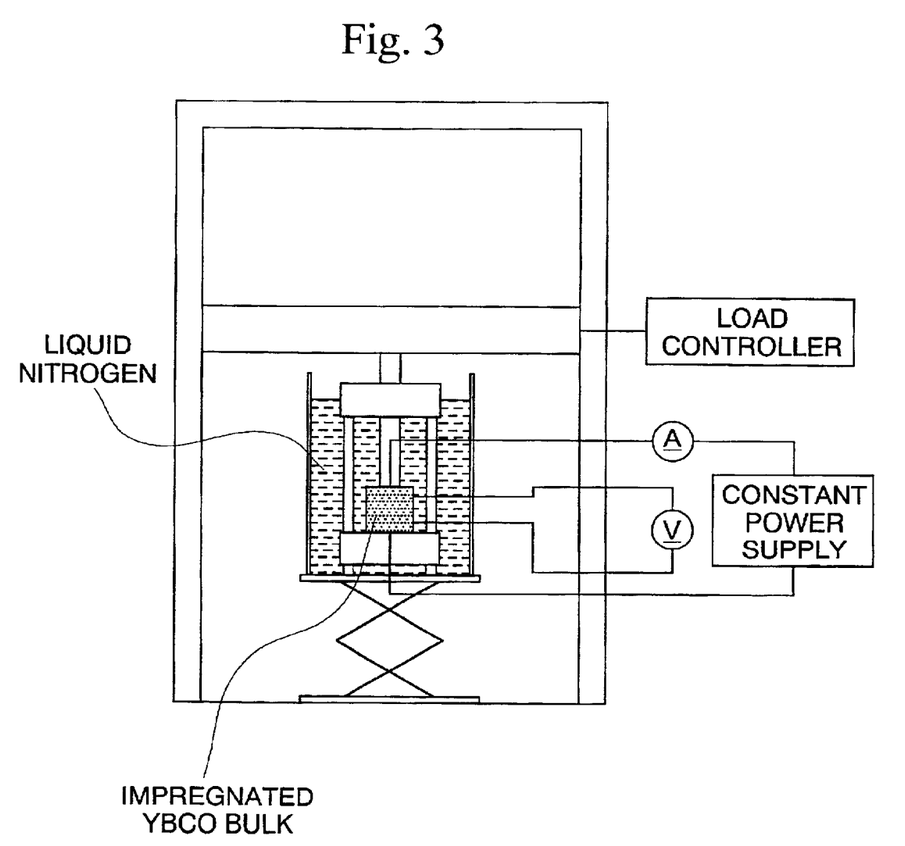
FIG. 3 is a schematic view of a transport measurement device used in an embodiment.

Next, transport measurements were performed using a testing device as shown in FIG. 3. Two pieces of connector materials with resin impregnation were fixed closely in contact each other, and the pressure was applied between two samples with a load controller.

The entire testing device was directly immersed in liquid nitrogen, then the current was passed after the superconductors had been sufficiently cooled. The largest current applied was in a range of 10 A to 20 A. The voltage between two connector materials was measured using a four terminal method.

We used two different pairs of connector materials. One pair with fine polishing and the other without surface polishing.

During the transport measurements, a load of 100 N and 500 N was applied between two connector materials. In a 100 N loading test, the current was changed in the process 0 A→10 A→0 A with 100 N of load applied to the connector materials without surface polishing. This current increasing and decreasing processes were repeated five times.

In a 500 N loading test, the current was changed in the process 0 A→14 A→0 A with 500 N of load applied to the connector materials without surface polishing, and this current increasing and decreasing processes were repeated three times.

We also checked the effects of load on the current carrying capacity in that loads of 100 N, 300 N, 500 N, 700 N, and 900 N were applied to the connector materials with surface polishing, and the current was changed in the process 0 A→10 A.

Figure 4:
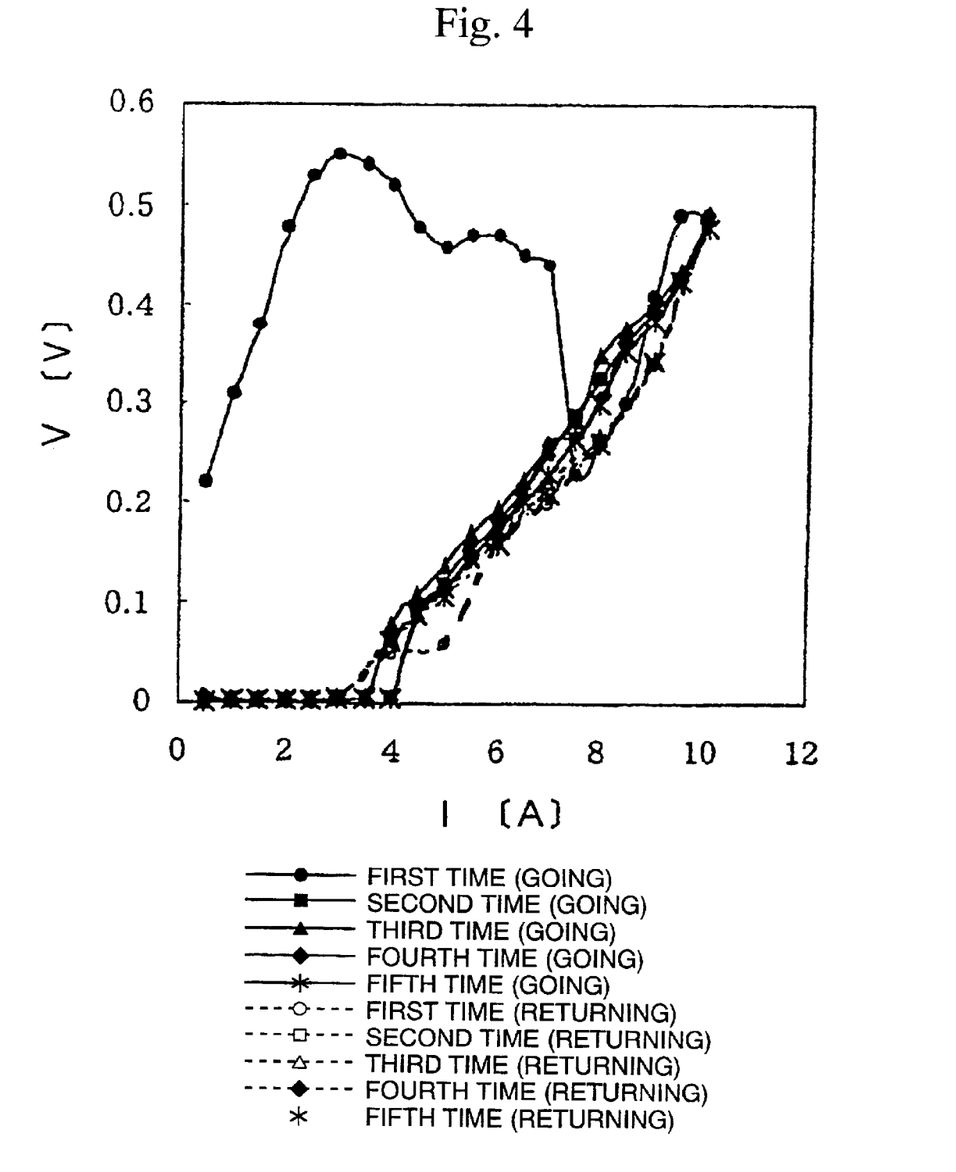
FIG. 4 is a chart showing the relationships between the voltage (V) and the current (I), which were obtained in 100 N loading tests for the connector materials (bulk superconductors) manufactured in an embodiment.

FIG. 4 shows a relationship between the voltage (V) and the current (I) (V-I characteristics) which were obtained in a 100 N loading test. The following facts are deduced from FIG. 4.

When the current value is increased for the first time, the voltage value is comparably high and fluctuating. The voltage value increases with increasing I and begins decreasing gradually at the peak of 3 A, then suddenly decreases after having reached 7 A. After that, the voltage increases almost linearly with the current value above the current value of 7.5 A.

When the current value decreases for the first time, the voltage value decreases in an almost linear manner. The voltage then suddenly drops to almost zero and the resistance reached as small as 1 m$\Omega$ at 3.5 A of current value. Such a phenomenon is particular to the normal to superconductor transition.

For the second increasing and decreasing process V-I characteristics are the superconducting state in a low current level and then transform to the normal conducting state and follow the ohmic resistance.

Figure 5:
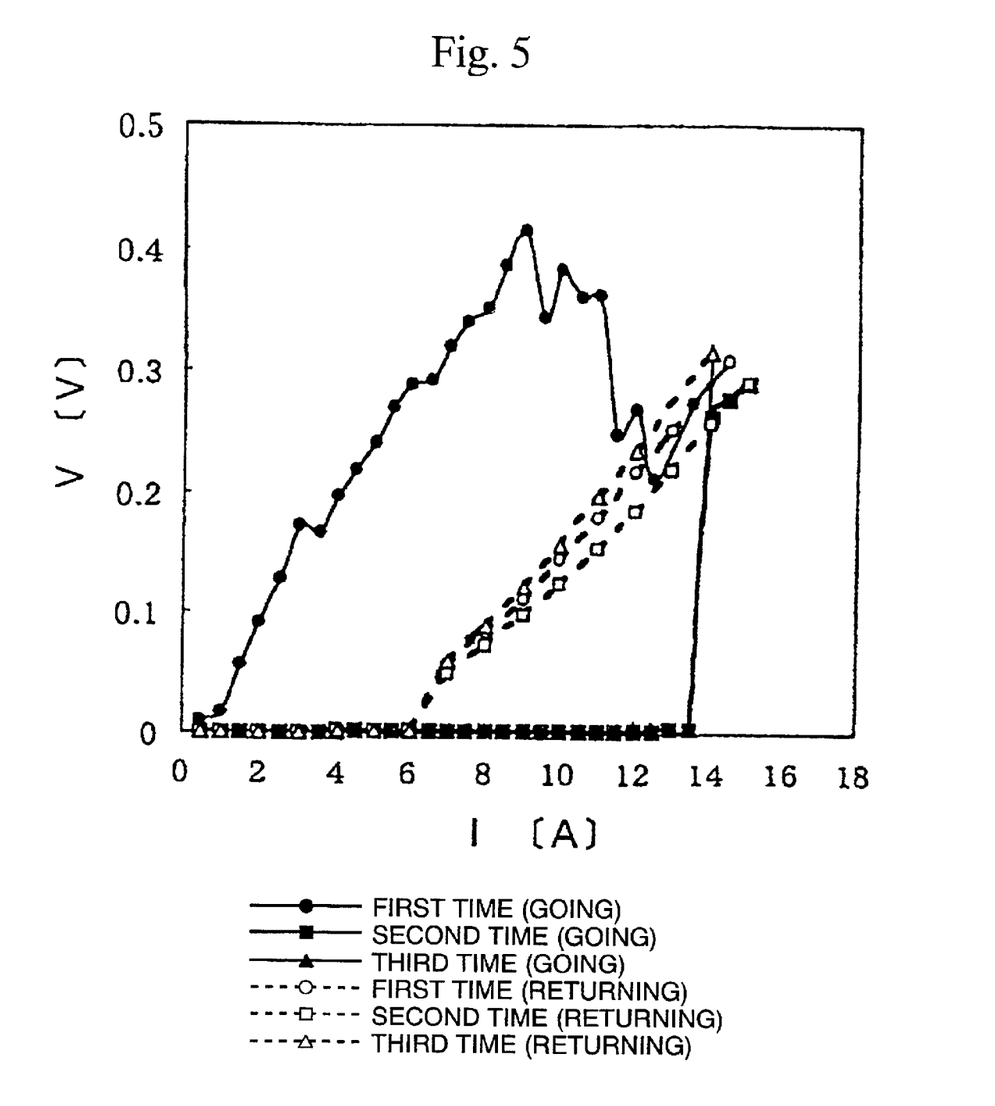
FIG. 5 is a chart showing a relationship between the voltage (V) and the current (I), which were obtained with 500 N loading tests for the connector materials (bulk superconductors) manufactured in an embodiment.

FIG. 5 shows the V-I characteristics obtained in a 500 N loading test. The following facts are deduced from FIG. 5.

The voltage value during the increasing current process in the first run fluctuates and shows the peak at 9 A, becomes stable above 12 A, then follows the ohmic resistance behavior.

When the current value decreases in the first run, the voltage value decreases in an almost linear manner. The voltage value suddenly drops and the resistance is as small as 0.3 m$\Omega$ at 6 A. Such a phenomenon of sudden voltage drop is similar to the case of a 100 N loading test.

After the first run, the V-I characteristics during the increasing and decreasing current processes were similar in all the processes and showed the superconducting state in a low current level and the ohmic behavior above the critical current value.

After these tests, the contact surfaces of the connector materials were polished again; then subjected to a 500 N loading test. The results of the first and the second run were almost similar to those of the previous measurements.

Figure 6:
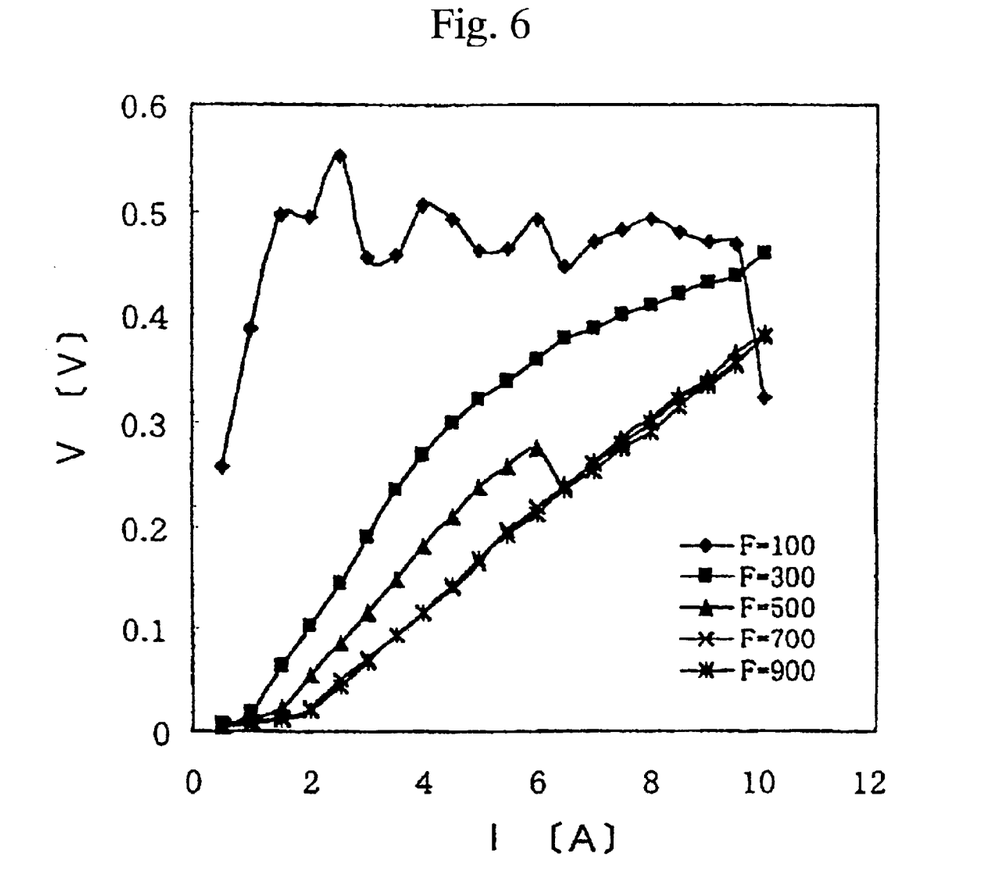
FIG. 6 is a chart showing a relationship between the voltage (V) and the current (I), which were obtained in a test with alternating load condition for the connector materials (bulk superconductors) manufactured in an embodiment.

FIG. 6 shows the V-I characteristics obtained with changing the load level. The following facts are deduced from FIG. 6.

The voltage of a 100 N loading test was always the highest. The voltage in the first run was always unstable and fluctuating, and similar behavior was observed in all the load levels.

The voltage value decreased with increasing the load from 100 N to 700 N. The voltage value was almost constant when the load exceeded 700 N, showing the saturation. These results show that it is possible to decrease the contact resistance by increasing the load applied to the contact surfaces of connector materials.

According to the transport measurements, the following facts are deduced. In every test, the voltage during the current increasing process in the first run shows a comparably high value and is fluctuating.

In the first run in a 500 N loading test, the voltage increased with increasing current and started decreasing after reaching the peak at 9 A up to 12.5 A. Such a decreasing process between 9 A and 12.5 A was unstable. Above 12.5 A, the V-I characteristics followed the ohmic behavior.

The results of a 100 N loading test was similar to those of the 500 N loading test. No such tendency could be observed in the transport measurements with different load values. For example, in the transport measurements at the load of 500N, the phenomenon of voltage decrease was not observed, even though the connector material was the same. In a load alternating test, the maximum transport current was 10 A, thus the voltage value did not reach the level of 9 A to 12.5 A which is required to break an insulating surface layer.

As mentioned before, in RE—Ba—Cu—O high temperature superconductors, oxygen atoms at the surface are reactive, and thereby a thin insulating layer that disrupts superconductivity because of oxygen deficiency is formed on the surface of the superconductor. According to the above test results, it is anticipated that such an insulating layer was broken during the increasing current process. The threshold current value exists to break the insulating layer so that the current must be increased above this critical value to achieve the ohmic contact.

As one probable mechanism of breakage of the insulating layer, electric discharge is raised. Arc-discharge is a continuous discharge, and is the last form of the electric discharge. That is, even though electric discharge is glow-discharge in an early stage, it finally changes to arc-discharge when the current is increased.

The current density of arc-discharge is the largest among various forms of electric discharge, while the discharged voltage of arc-discharge is the lowest. For example, it is anticipated that glow-discharge occurs in the range where voltage increases with increasing the current in the first run of the current increasing process in a 500 N loading test. The current density of glow discharge is smaller than that of arc-discharge; thus, the voltage becomes high.

The range where the voltage decreases and transforms unstably to the conductive state will correspond to the transition stage where the glow-discharge changes to arc-discharge. The temperature inside the arc column reaches 5000 K to 7000 K, but the temperature of the connector materials will remain below the critical temperature $T_c$ due to the cooling with liquid nitrogen.

As seen in the results of the 500 N loading test, the V-I curves in the increasing and decreasing current processes are different. The reason for this difference is ascribed to an increase in temperature of the connector materials (bulk superconductors).

That is, the temperature and the current are less than the critical temperature $T_c$ and the critical current $I_c$ of the superconductor until the current reaches 13.5 A. When the current exceeds 13.5 A, either the temperature or the current exceeds $T_c$ or $I_c$, then Joule's heat is generated in the connector materials (bulk superconductors). During the current decreasing process, the Joule heat will not be effectively taken away from the superconductor due to its relatively large thermal capacity and the current become less than $I_c$ at 6 A, where a sudden drop of voltage takes place.

According to Holm's equation regarding constriction resistance, the relationship between a contact area and a contact resistance can be represented by the following equation (1).

$$\text{Contacting Resistance}: R_C = \frac{\rho}{2} \frac{\sqrt{\pi}}{\sqrt{S_C}} \quad (1)$$

$$\begin{pmatrix} S_C: \text{Contacting Area} \\ \rho: \text{Resistivity of Superconductor} \end{pmatrix}$$

In a 100 N loading test, the residual resistance was 1 mΩ at 3.5 A in the pseudo-superconducting state. In contrast, in a 500 N loading test, the residual resistance was 0.3 mΩ at 13.5 A in the pseudo-superconducting state. Such a difference reflects a difference in the effective contacting area with and without polishing.

According to above equation (1), it is understood that the effective contacting area was enlarged by nearly nine times with surface polishing.

In the test of this embodiment, the connector material (bulk superconductor) was polished with a comparably simple method, that is, with abrasive papers. The lower resistivity can be thus anticipated if polishing is further refined.

The results of load alternating tests show that the contacting area can be increased by increasing the load to the contacting surfaces.

Next, the energy loss of a PCS is calculated according to the test results, and the analysis for practical use level is conducted.

Figure 7:
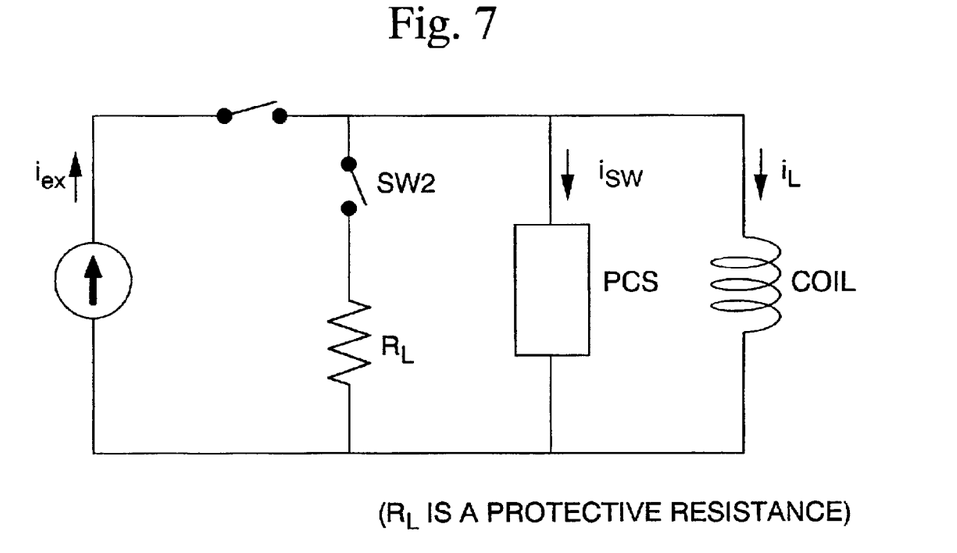
FIG. 7 is an equivalent circuit of a superconducting magnetic energy storage device.

First, a loss ($E_{ex}$) of a thermal or magnetic PCS during excitation and demagnetization operation is given by the following equation (2) according to the equivalent circuit shown in FIG. 7.

$$E_{ex} = \frac{(LJ_0)^2}{R_{off}}\left[T_1 - \frac{L}{R_{off}}\left\{\frac{1}{2}\exp\left(-2\frac{R_{off}}{L}T_1\right) - 2\exp\left(-\frac{R_{off}}{L}T_1\right) + \frac{3}{2}\right\}\right] \quad [J] \quad (2)$$

$$\begin{pmatrix} L: \text{Inductance} \\ J_0: \text{Excitation} \\ R_{off}: \text{Resistance of PCS off} \\ T_1: \text{Excitation Time} \end{pmatrix}$$

A loss ($E_{st}$) of a mechanical persistent current switch in a persistent current mode is given by the following equation (3).

$$E_{st} = \frac{1}{2}LI_0^2\left\{1 - \exp\left(-2\frac{R_{on}}{L}T_2\right)\right\} \quad [J] \quad (3)$$

$$\begin{pmatrix} L: \text{Inductance} \\ I_0: \text{Constant Electricity} \\ R_{on}: \text{Resistance of PCS on} \\ T_2: \text{Time} \end{pmatrix}$$

Calculation is conducted under the condition that there is no loss in the persistent current mode both for a thermal and magnetic PCS. The off-resistance value in a thermal and magnetic PCS is 6Ω, and the time for excitation and demagnetization is 6 hours.

A loss of thermal or magnetic PCS is then calculated to be 160 MJ during excitation and demagnetization in the case of a SMES with the storage capacity of 10 GWh, the constant current of 500 kA, and the inductance of 288 H. Such a loss is equivalent to the loss of a MPCS with an on-resistance value of 0.12Ω.

The on-resistance value of a MPCS of the present invention is 0.3Ω. This value can be reduced to the level far below 0.12Ω with refined polishing operation and optimization of loading amount.

What is claimed is:

1. A mechanical persistent current switch comprising:
   a bulk member of an RE—Ba—Cu—O superconductor, RE representing a rare earth element,
   wherein said bulk member is made by a melt process in which resin including fillers having a low thermal expansion coefficient in a dispersed manner are impregnated and
   connector material forming a current terminal and a voltage terminal on said bulk member, wherein the contacting surfaces of the connector material are polished, and a direction of current is perpendicular to an ab surface of the bulk member by making the contact surface of the connector material parallel to the ab surface of the connector material.

* * * * *

UNITED STATES PATENT AND TRADEMARK OFFICE
CERTIFICATE OF CORRECTION

PATENT NO.     : 6,870,452 B2
DATED          : March 22, 2005
INVENTOR(S)    : Masaru Tomita et al.

It is certified that error appears in the above-identified patent and that said Letters Patent is hereby corrected as shown below:

Title page,
Item [73], Assignee, please delete "International Supperconductivity Technology Center, the Juridical Foundation, Tokyo (JP)" and substitute -- International Superconductivity Technology Center, the Juridical Foundation, Tokyo (JP) --.

Signed and Sealed this

Thirty-first Day of May, 2005

JON W. DUDAS
*Director of the United States Patent and Trademark Office*